(12) United States Patent
Yu et al.

(10) Patent No.: US 8,963,019 B2
(45) Date of Patent: Feb. 24, 2015

(54) MANUFACTURING METHOD OF CIRCUIT BOARD

(75) Inventors: Cheng-Po Yu, Taoyuan County (TW); Shang-Feng Huang, Taoyuan County (TW); Chang-Ming Lee, Taoyuan County (TW); Young-Sheng Bai, Taoyuan County (TW)

(73) Assignee: Unimicron Technology Corp., Taoyuan (TW)

( * ) Notice: Subject to any disclaimer, the term of this patent is extended or adjusted under 35 U.S.C. 154(b) by 209 days.

(21) Appl. No.: 13/570,251

(22) Filed: Aug. 9, 2012

(65) Prior Publication Data

US 2013/0327564 A1 Dec. 12, 2013

(30) Foreign Application Priority Data

Jun. 11, 2012 (TW) .............................. 101120909 A

(51) Int. Cl.
*H05K 1/11* (2006.01)
*H05K 3/00* (2006.01)

(52) U.S. Cl.
USPC ........... 174/262; 427/97.4; 427/535; 156/280

(58) Field of Classification Search
USPC .................. 156/280; 174/262; 427/97.4, 535
See application file for complete search history.

(56) References Cited

U.S. PATENT DOCUMENTS

| 5,869,899 A | * | 2/1999 | Arledge et al. | ................ | 257/738 |
| 2007/0092638 A1 | * | 4/2007 | Schoedner et al. | .......... | 427/98.6 |
| 2009/0309202 A1 | * | 12/2009 | Hsu et al. | ...................... | 257/680 |

FOREIGN PATENT DOCUMENTS

| JP | 2010135719 A | * | 6/2010 |
| TW | I273866 | | 2/2007 |
| TW | I288591 | | 10/2007 |
| TW | I305117 | | 1/2009 |
| TW | 201021652 | | 6/2010 |
| TW | 201023701 | | 6/2010 |

OTHER PUBLICATIONS

"Office Action of Taiwan Counterpart Application", issued on Dec. 24, 2013, p. 1-p. 8, in which the listed references were cited.

* cited by examiner

*Primary Examiner* — Timothy Thompson
*Assistant Examiner* — Charles Pizzuto
(74) *Attorney, Agent, or Firm* — Jianq Chyun IP Office

(57) ABSTRACT

A circuit board and a manufacturing method thereof are provided. According to the method, a dielectric layer is formed on a dielectric substrate, and the dielectric layer contains active particles. A surface treatment is performed on a surface of the dielectric first conductive layer is formed on the activated surface of the dielectric layer. A conductive via is formed in the dielectric substrate and the dielectric layer. A patterned mask layer is formed on the first conductive layer, in which the patterned mask layer exposes the conductive via and a part of the first conductive layer. A second conductive layer is formed on the first conductive layer and conductive via exposed by the patterned mask layer. The patterned mask layer and the first conductive layer below the patterned mask layer are removed.

7 Claims, 3 Drawing Sheets

MANUFACTURING METHOD OF CIRCUIT BOARD

CROSS-REFERENCE TO RELATED APPLICATION

This application claims the priority benefit of Taiwan application serial no. 101120909, filed on Jun. 11, 2012. The entirety of the above-mentioned patent application is hereby incorporated by reference herein and made a part of this specification.

BACKGROUND OF THE INVENTION

1. Field of the Invention

The invention generally relates to a circuit board and a manufacturing method thereof, and more particularly, to a circuit board and a manufacturing method thereof which increases the adhesive strength between the copper layer and the dielectric layer in a modified semi-additive process (MSAP) through active particles in the dielectric layer.

2. Description of Related Art

In recent years, along with the staggering advancements of electronic technology, the high-tech electronics industries have come out one after another, so that electronic products with more humanized features and powerful functions are ceaselessly upgraded and developed towards the light, slim, short, small design tendency. In these electronic products, usually circuit boards with conductive traces are employed and disposed.

In order to increase the wiring density in a circuit board, a subtractive process is used to fabricate the circuit layer with line width of more than 40 µm in the circuit board. However, for line width of less than 40 µm, the subtractive process used to fabricate the circuit layer would reduce the product yield. Therefore, a semi-additive process (SAP) or a modified semi-additive process (MSAP) is used currently for fabricating the circuit layer with line width of less than 40 µm.

However, for a copper-clad laminate (CCL) used in an MSAP, the copper layer thereof is formed by laminating an ultra-thin copper foil with thickness of 3 µm with a dielectric substrate. Since the ultra-thin copper foil is quite thin and usually has low roughness (centreline arithmetic average roughness Ra and 10-point average roughness Rz), the adhesive strength between the circuit layer and the dielectric layer is poor. If making the copper foil further thinner, even the copper layer may be peeled from the dielectric substrate during the fabricating process, which reduces the reliability of the circuit board.

SUMMARY OF THE INVENTION

Accordingly, the invention is directed to a manufacturing method of circuit board which increases the adhesive strength between the circuit layer and the dielectric layer through active particles in the dielectric layer.

The invention further is directed to a circuit board in which the adhesive strength between the circuit layer and the dielectric layer is increased through active particles in the dielectric layer.

The invention provides a manufacturing method of circuit board. According to the method, first a dielectric layer is formed on a dielectric substrate, in which the dielectric layer contains a plurality of active particles therein. Next, a surface treatment is performed on a surface of the dielectric layer to expose a part of the active particles. Thereafter, a first conductive layer is formed on the activated surface of the dielectric layer. Then, a conductive via is formed in the dielectric substrate and the dielectric layer. After that, a patterned mask layer is formed on the first conductive layer, in which the patterned mask layer exposes the conductive via and a part of the first conductive layer. Further, a second conductive layer is formed on the first conductive layer and the conductive via exposed by the patterned mask layer. Finally, the patterned mask layer and the first conductive layer below the patterned mask layer are removed.

According to the manufacturing method of circuit board in the embodiment of the invention, the material of the active particles is metal complexes, for example.

According to the manufacturing method of circuit board in the embodiment of the invention, the surface treatment is, for example, plasma processing or chemical solution cleaning processing.

According to the manufacturing method of circuit board in the embodiment of the invention, the method of forming the first conductive layer is, for example , lamination, coating method or spraying method.

According to the manufacturing method of circuit board in the embodiment of the invention, the thickness of the first conductive layer is, for example, less than the thickness of the second conductive layer.

According to the manufacturing method of circuit board in the embodiment of the invention, the roughness of the surface facing the dielectric layer of the first conductive layer is, for example, less than or equal to 3 µm.

According to the manufacturing method of circuit board in the embodiment of the invention, the centreline arithmetic average roughness (Ra) and 10-point average roughness (Rz) of the surface facing the dielectric layer of the first conductive layer are, for example, less than or equal to 3 µm.

The invention further provides a circuit board, which includes a dielectric substrate, a dielectric layer, a conductive via and a circuit layer. The dielectric layer is disposed on the dielectric substrate, in which the dielectric layer contains a plurality of active particles therein and a surface of the dielectric layer exposes a part of the active particles. The conductive via is disposed in the dielectric substrate and the dielectric layer. The circuit layer is disposed on the surface of the dielectric layer and connected to the conductive via.

According to the circuit board in the embodiment of the invention, the material of the active particles is, for example, metal complexes.

According to the circuit board in the embodiment of the invention, the circuit layer includes a first conductive layer and a second conductive layer on the first conductive layer, the first conductive layer is disposed on the surface of the dielectric layer and the thickness of the first conductive layer is, for example, less than the thickness of the second conductive layer.

According to the circuit board in the embodiment of the invention, the roughness the surface facing the dielectric layer of the first conductive layer is, for example, less than or equal to 3 µm.

According to the circuit board in the embodiment of the invention, the centreline arithmetic average roughness (Ra) and 10-point average roughness (Rz) of the surface facing the dielectric layer of the first conductive layer are, for example, less than or equal to 3 µm.

Based on the description above, in the invention, the first conductive layer is effectively adhered onto the dielectric layer through the active particles in the dielectric layer. As a result, the first conductive layer can have less thickness and lower roughness and is unable to be peeled from the dielectric layer. In this way, the line width of the circuit layer in the invention can be further smaller to meet the demand of high wiring density.

Other objectives, features and advantages of the present invention will be further understood from the further technological features disclosed by the embodiments of the present invention wherein there are shown and described preferred embodiments of this invention, simply by way of illustration of modes best suited to carry out the invention.

DESCRIPTION OF THE EMBODIMENTS

FIGS. 1A-1E are cross-sectional diagrams showing the manufacturing flow of a circuit board according to an embodiment of the invention. First, referring to FIG. 1A, a dielectric layer 102 is formed on a dielectric substrate 100. The material of the dielectric substrate 100 is, for example, epoxy resin, modified epoxy resin, polyester, acrylate, fluoropolymer, polyphenylene oxide, polyimide, phenolicresin, polysulfone, silicone polymer, bismaleimide triazine modified epoxy (i.e., BT resin), cyanate ester, polyethylene, polycarbonate (PC), acrylonitrile-butadiene-styrene copolymer (ABS copolymer), polyethylene terephthalate (PET), polybutylene terephthalate (PBT), liquid crystal polymers (LCP), polyamide 6 (PA 6), nylon, polyoxymethylene (POM), polyphenylene sulfide (PPS), cyclic olefin copolymer (COC) or any combination of the above-mentioned materials. The material of the dielectric layer 102 is, for example, epoxy resin, modified epoxy resin, polyester, acrylate, fluoro-polymer, polyphenylene oxide, polyimide, phenolicresin, polysulfone, silicone polymer, bismaleimide triazine modified epoxy, cyanate ester, polyethylene, polycarbonate (PC), acrylonitrile-butadiene-styrene copolymer (ABS copolymer), polyethylene terephthalate (PET), polybutylene terephthalate (PBT), liquid crystal polymers (LCP), polyamide 6 (PA 6), nylon, polyoxymethylene (POM), polyphenylene sulfide (PPS), cyclic olefin copolymer (COC) or any combination of the above-mentioned materials. In addition, the dielectric layer 102 contains active particles 102a therein, and the active particles 102a are evenly distributed in the dielectric layer 102. The material of the active particles 102a is, for example, metal complexes. The active particles 102a are able to increase the adhesive strength between the dielectric layer 102 and the metal material which is formed on the dielectric layer 102 in the successive process. In more details, the material of the active particles 102a can be metal oxides, metal nitrides, metal complexes, metal chelates or any combination of the above-mentioned compounds. For example, the material of the active particles 102a can be aluminium nitride, copper oxide, titanium nitride, cobalt molybdenum bimetallic nitride ($Co_2Mo_3N_x$) particles or palladium metal particles.

Figure 1A:
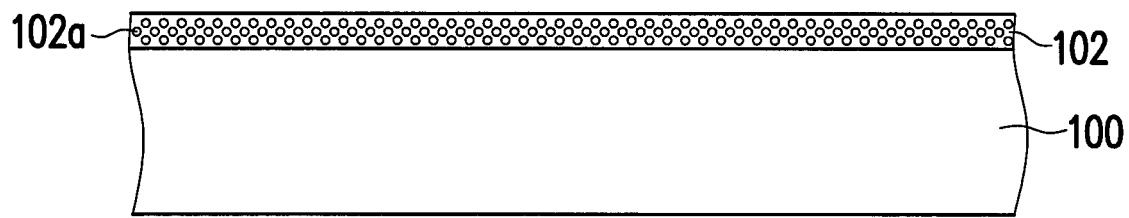
FIGS. 1A-1E are cross-sectional diagrams showing the manufacturing flow of a circuit board according to an embodiment of the invention.
Figure 1B:
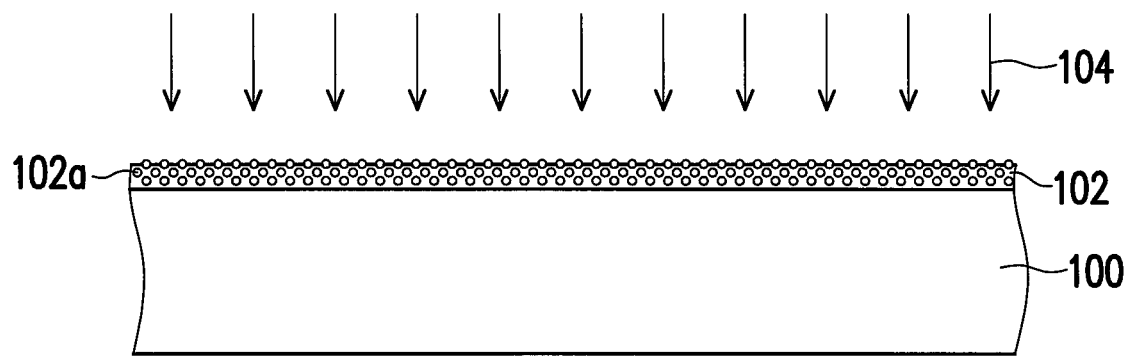

Next referring to FIG. 1B, a surface treatment 104 is performed on the surface of the dielectric layer 102 so as to expose a part of the active particles 102a. The surface treatment 104 is, for example, plasma processing or chemical solution cleaning processing. In more details, through the surface treatment 104, the surface of the dielectric layer 102 is slightly etched to expose the active particles 102a adjacent to the surface of the dielectric layer 102.

Figure 1C:
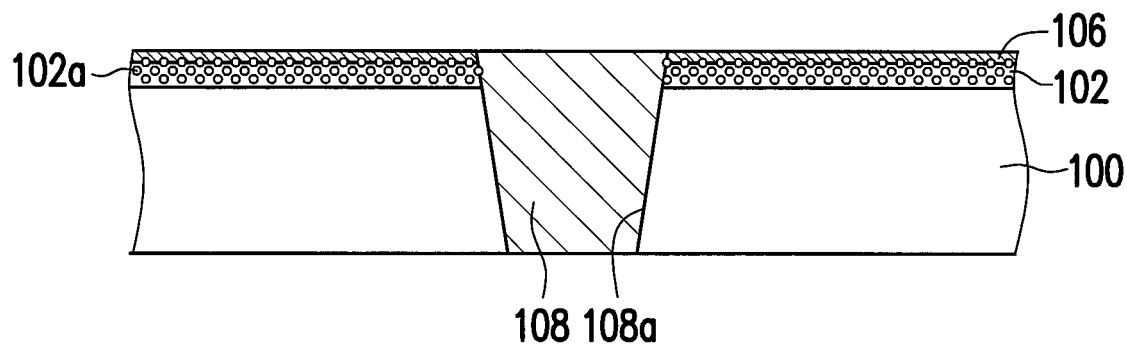

Then referring to FIG. 1C, a first conductive layer 106 is formed on the surface of the dielectric layer 102. The material of the first conductive layer 106 is, for example, copper, silver or aluminium and the method of forming the first conductive layer 106 is, for example, laminating, coating method or spraying method. Since the active particles 102a are exposed by the surface of the dielectric layer 102, the first conductive layer 106 is able to effectively adhere onto the dielectric layer 102. In particular, since the first conductive layer 106 can be effectively adhered onto the dielectric layer 102 through the active particles 102a, so that the first conductive layer 106 can have smaller thickness and lower roughness to benefit the fabrication of a fine pitch circuit. The thickness of the first conductive layer 106 is, for example, between 2 μm and 5 μm. In addition, the roughness of the surface facing the dielectric layer 102 of the first conductive layer 106 is, for example, less than or equal to 3 μm. For example, both the centreline arithmetic average roughness Ra and the 10-point average roughness Rz of the surface facing the dielectric layer 102 of the first conductive layer 106 are, for example, less than or equal to 3 μm. The definitions and the measuring methods of the above-mentioned roughnesses can refer to Japan Industry Standard JIS B 0601.

Then referring to FIG. 1C, the conductive via 108 is formed in the dielectric substrate 100 and the dielectric layer 102, in which the conductive via 108 is formed by using, for example, laser drilling process firstly to form a through hole 108a in the first conductive layer 106, the dielectric layer 102 and the dielectric substrate 100, followed by performing plating or other process to fill a conductive material in the through hole 108a.

Figure 1D:
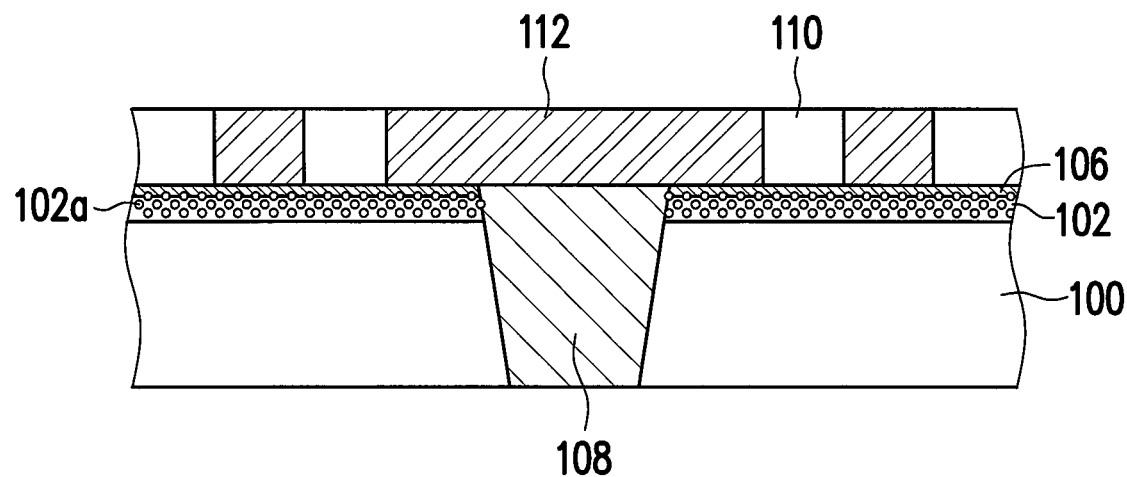

Thereafter referring to FIG. 1D, a patterned mask layer 110 is formed on the first conductive layer 106. The material of the patterned mask layer 110 is, for example, photoresist. The patterned mask layer 110 exposes the conductive via 108 and a part of the first conductive layer 106, that is, to expose an area predetermined for wiring. Then, a second conductive layer 112 is formed on the first conductive layer 106 and conductive via 108 exposed by the patterned mask layer 110. The material of the second conductive layer 112 is, for example, copper, silver or aluminium and the method of forming the second conductive layer 112 is, for example, plating. The thickness of the second conductive layer 112 is, for example, greater than the thickness of the first conductive layer 106.

Figure 1E:
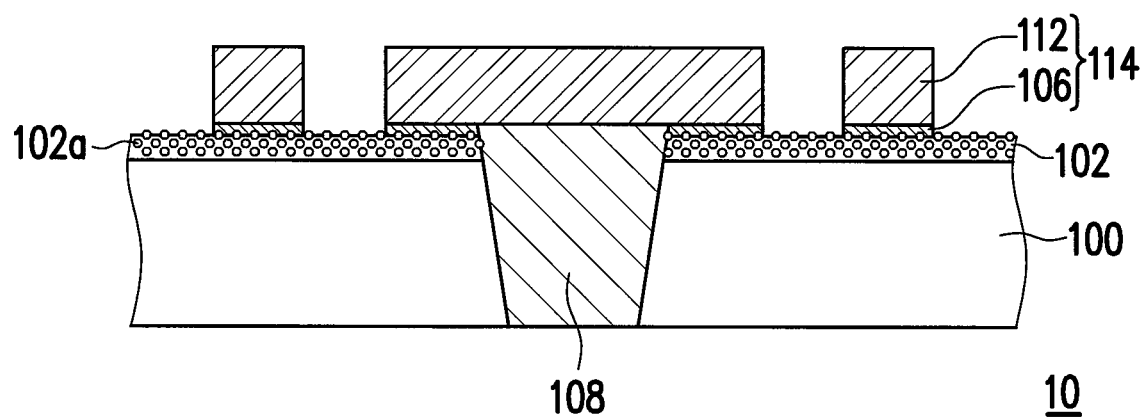

Further referring to FIG. 1E, the patterned mask layer 110 is removed. Finally, the first conductive layer 106 below the patterned mask layer 110 is removed to finish the fabrication of the circuit board 10. In the embodiment, the first conductive layer 106 is removed with, for example, etching. After removing the first conductive layer 106 below the patterned mask layer 110, the second conductive layer 112 and the first conductive layer 106 below the second conductive layer 112 together form the circuit layer 114 connected to the conductive via 108.

The steps from FIG. 1D to FIG. 1E are usually referred as MSAP. The circuit layer 114 formed by MSAP can have line width less than 40 μm which can meet the demand of high wiring density. In the embodiment, since the first conductive layer 106 is effectively adhered onto the dielectric layer 102 through the active particles 102a in the dielectric layer 102, the first conductive layer 106 can have smaller thickness and lower roughness without being peeled from the dielectric layer 102. Through the feature, the line width of the circuit layer 114 can be further made within a lower range between 15 μm and 25 μm. In an embodiment, a tensile testing result indicates the adhesive strength between the first conductive layer 106 and the dielectric layer 102 can reach over 1 kgf/ cm². In other words, the reliability of the circuit board 10 in the embodiment would not be reduced with a smaller line width of the circuit layer 114.

It will be apparent to those skilled in the art that the descriptions above are several preferred embodiments of the invention only, which does not limit the implementing range of the invention. Various modifications and variations can be made to the structure of the invention without departing from the scope or spirit of the invention. The claim scope of the invention is defined by the claims hereinafter.

What is claimed is:

1. A manufacturing method of circuit board, comprising:
   providing a dielectric substrate;
   forming a dielectric layer on the dielectric substrate, wherein the dielectric layer contains a plurality of active particles therein;
   performing a surface treatment on a surface of the dielectric layer so as to activate the active particles at the surface of the dielectric layer;
   forming a first conductive layer on the activated surface of the dielectric layer;
   forming a conductive via in the dielectric substrate and the dielectric layer;
   forming a patterned mask layer on the first conductive layer, wherein the patterned mask layer exposes the conductive via and a part of the first conductive layer;
   forming a second conductive layer on the first conductive layer and conductive via exposed by the patterned mask layer; and
   removing the patterned mask layer and the first conductive layer below the patterned mask layer.

2. The manufacturing method of circuit board as claimed in claim 1, wherein a material of the active particles comprises metal complexes.

3. The manufacturing method of circuit board as claimed in claim 1, wherein the surface treatment comprises plasma processing or chemical solution cleaning processing.

4. The manufacturing method of circuit board as claimed in claim 1, wherein a method of forming the first conductive layer comprises lamination, coating method or spraying method.

5. The manufacturing method of circuit board as claimed in claim 1, wherein a thickness of the first conductive layer is less than a thickness of the second conductive layer.

6. The manufacturing method of circuit board as claimed in claim 1, wherein a roughness of the surface facing the dielectric layer of the first conductive layer is less than or equal to 3 μm.

7. The manufacturing method of circuit board as claimed in claim 6, wherein a centreline arithmetic average roughness (Ra) and a 10-point average roughness (Rz) of the surface facing the dielectric layer of the first conductive layer are less than or equal to 3 μm.

* * * * *